United States Patent [19]
Choi

[11] Patent Number: 5,495,189
[45] Date of Patent: Feb. 27, 1996

[54] NON-OVERLAP SIGNAL GENERATION CIRCUIT

[75] Inventor: Hong S. Choi, Seoul, Rep. of Korea

[73] Assignee: Goldstar Electron Co., Ltd., Choongchungbook-Do, Rep. of Korea

[21] Appl. No.: 362,315

[22] Filed: Dec. 22, 1994

[30] Foreign Application Priority Data

Nov. 11, 1994 [KR] Rep. of Korea .................. 29652/1994

[51] Int. Cl.⁶ .............................................. H03K 19/096
[52] U.S. Cl. .............................. 326/97; 327/295; 327/259
[58] Field of Search .................. 326/96, 97; 327/293, 327/295, 239, 259

[56] References Cited

U.S. PATENT DOCUMENTS

| | | | |
|---|---|---|---|
| 4,456,837 | 6/1984 | Schade, Jr. | 327/295 |
| 4,625,126 | 11/1986 | Tinker | 327/295 |
| 4,761,568 | 8/1988 | Stronski | 327/295 |
| 5,047,659 | 9/1991 | Ulrich | 327/295 |
| 5,173,618 | 12/1992 | Eisenstadt | 327/239 |

*Primary Examiner*—Edward P. Westin
*Assistant Examiner*—Andrew Sanders
*Attorney, Agent, or Firm*—Lowe, Price, LeBlanc & Becker

[57] ABSTRACT

A non-overlap signal generation circuit for a semiconductor memory device which generates two non-overlapped output signals of complementary logic levels with respect to one input signal. The circuit comprises first and second data paths. The first data path includes a first transistor for transiting a first output node from logic "0" to logic "1" when the input signal is transited from logic "0" to logic "1", whereas from logic "1" to logic "0" when the input signal is transited from logic "1" to logic "0", a first inverter for inverting the input signal, and a second transistor for transiting the first output node from logic "1" to logic "0" in response to an output signal from the first inverter. The second data path includes a third transistor for transiting a second output node from logic "0" to logic "1" when the output signal from the first inverter is transited from logic "0" to logic "1", whereas from logic "1" to logic "0" when the output signal from the first inverter is transited from logic "1" to logic "0", a second inverter for inverting the output signal from the first inverter, and a fourth transistor for transiting the second output node from logic "1" to logic "0" in response to an output signal from the second inverter.

9 Claims, 3 Drawing Sheets

FIG. 3A
CONVENTIONAL ART
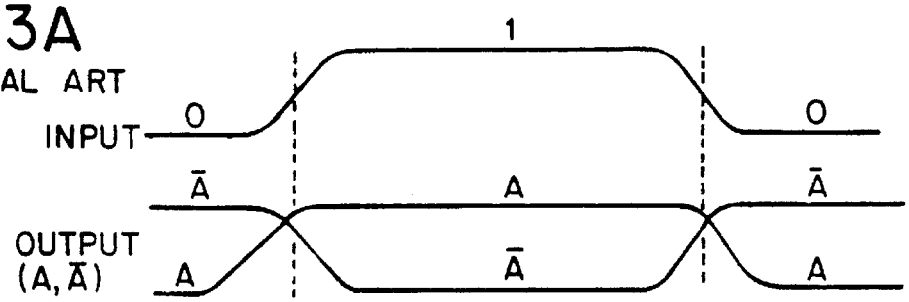
FIG. 3B
CONVENTIONAL ART
FIG. 4
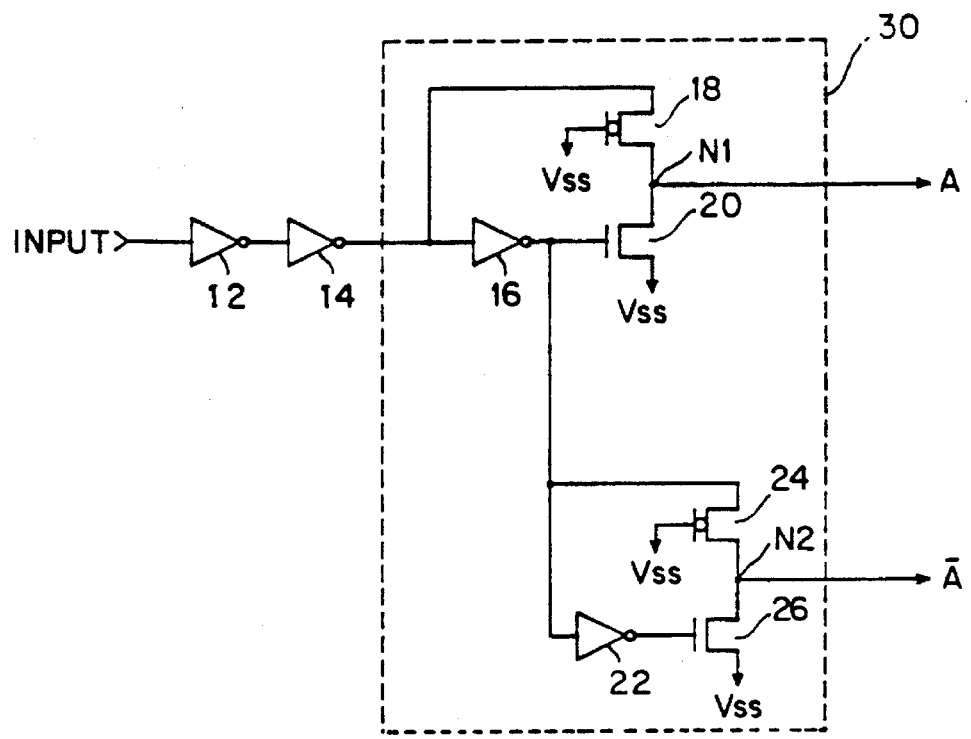

NON-OVERLAP SIGNAL GENERATION CIRCUIT

BACKGROUND OF THE INVENTION

1. Field of the Invention

The present invention relates in general to a semiconductor memory device, and more particularly to a non-overlap signal generation circuit for generating non-overlapped signals at a buffer stage of a high-speed memory device.

2. Description of the Prior Art

Generally, a semiconductor memory device comprises data and address input buffers, each of which outputs two signals of complementary logic levels with respect to one input signal. Because the logic levels of the output signals are complementary to each other, they must be non-overlapped. To this end, a non-overlap signal generation circuit has widely been used.

Referring to FIG. 1, there is shown a circuit diagram of a conventional non-overlap signal generation circuit for the semiconductor memory device. As shown in this drawing, the conventional non-overlap signal generation circuit comprises two inverters I1 and I2 connected in series for inverting sequentially an input signal, and a non-overlap circuit 10 for generating two non-overlapped output signals A and /A of complementary logic levels with respect to the input signal. The non-overlap circuit 10 includes an inverter I3 and a NAND gate ND1 connected in series to an output terminal of the inverter I2 for inputting an output signal from the inverter I2 and generating the first output signal A, and a NAND gate ND2 for inputting the output signal from the inverter I2 and generating the second output signal /A.

The input signal is sequentially inverted by the inverters I1 and I2. Then, the output signal from the inverter I2 is passed through a first path consisting of the inverter I3 and the NAND gate ND1 and then outputted as the first output signal A. Also, the output signal from the inverter I2 is passed through a second path consisting of the NAND gate ND2 and then outputted as the second output signal /A. The NAND gate ND1 has one input terminal connected to an output terminal of the NAND gate ND2, one input terminal of which is connected to the output terminal of the NAND gate ND1.

The operation of the conventional non-overlap signal generation circuit for the semiconductor memory device will hereinafter be described in detail with reference to FIGS. 2 and 3. FIG. 2 is a detailed circuit diagram of the non-overlap circuit 10 in FIG. 1 and FIG. 3 is a timing diagram illustrating an operation of the non-overlap circuit 10 in FIG. 2.

In FIG. 2, the inverter I3 includes a PMOS transistor 101 and an NMOS transistor 111. The NAND gate NDI includes PMOS transistors 102 and 103, and NMOS transistors 112 and 113. The NAND gate ND2 includes PMOS transistors 104 and 105, and NMOS transistors 114 and 115.

The input signal is sequentially inverted by the inverters I1 and I2 and then applied to the inverter I3, which has a low threshold voltage. First, in the case where the input signal is transited from logic "0" to logic "1", the PMOS transistor 101 is turned off, whereas the NMOS transistor 111 is turned on. As a result, the output of the inverter I3 becomes logic "0". Then, in the NAND gate ND1, the PMOS transistor 102 is turned on, whereas the NMOS transistor 112 is turned off. As a result, the output of the NAND gate ND1 is charged, thereby causing the first output signal A to become logic "1".

In the NAND gate ND2, in response to the input signal of logic "1", the PMOS transistor 104 is turned off, whereas the NMOS transistor 114 is turned on. Each of the PMOS transistor 105 and the NMOS transistor 115 has a gate for inputting the first output signal A from the NAND gate ND1. In response to the first output signal A from the NAND gate ND1, the PMOS transistor 105 is turned off, whereas the NMOS transistor 115 is turned on. As a result, the output of the NAND gate ND2 is discharged, thereby causing the second output signal /A to become logic "0". At this time, because the turning-on of the NMOS transistor 115 is somewhat delayed, the output of the NAND gate ND2 is discharged slower than the charging operation of the output of the NAND gate ND1.

In result, in the case where the input signal is transited from logic "0" to logic "1", the logic "1" charging time of the first output signal A is shorter than the logic "0" discharging time of the second output signal /A, so that the first and second output signals A and /A cannot be overlapped.

The above operation may be applied in a similar manner with respect to the case where the input signal is transited from logic "1" to logic "0".

In other words, the conventional non-overlap signal generation circuit is adapted to obtain the non-overlapped signals using a difference between the logic "1" charging time and the logic "0" discharging time.

However, the above-mentioned conventional non-overlap signal generation circuit has a disadvantage in that a sufficient non-overlap interval cannot in practice be obtained because of a time delay when the output of one NAND gate is applied to the input of the other NAND gate. In order to make up for this problem, a delay circuit may be employed. In this case, however, a chip area is increased and a transfer time between the input and output of the signal is increased. These have a bad effect on a high-speed operation of the semiconductor memory device.

SUMMARY OF THE INVENTION

Therefore, the present invention has been made in view of the above problems, and it is an object of the present invention to provide a non-overlap signal generation circuit for a semiconductor memory device which is simple in construction and applicable to a high-speed operation of the semiconductor memory device.

In accordance with the present invention, the above and other objects can be accomplished by a provision of a non-overlap signal generation circuit for a semiconductor memory device which generates two non-overlapped output signals of complementary logic levels with respect to one input signal, comprising a first data path including a first transistor for transiting a first output node from logic "0" to logic "1" when said input signal is transited from logic "0" to logic "1", whereas from logic "1" to logic "0" when said input signal is transited from logic "1" to logic "0", a first inverter for inverting said input signal, and a second transistor for transiting said first output node from logic "1" to logic "0" in response to an output signal from said first inverter; and a second data path including a third transistor for transiting a second output node from logic "0" to logic "1" when the output signal from said first inverter is transited from logic "0" to logic "1", whereas from logic "1" to logic "0" when the output signal from said first inverter is transited from logic "1" to logic "0", a second inverter for inverting the output signal from said first inverter, and a fourth transistor for transiting said second output node from logic "1" to logic "0" in response to an output signal from said second inverter; whereby said two non-overlapped output signals are generated according to a time difference between said first and second data paths.

BRIEF DESCRIPTION OF THE DRAWINGS

The above and other objects, features and advantages of the present invention will be more clearly understood from the following detailed description taken in conjunction with the accompanying drawings, in which:

FIG. 3 is a timing diagram illustrating an operation of the non-overlap circuit in FIG. 2;

FIG. 4 is a detailed circuit diagram of a non-overlap signal generation circuit for a semiconductor memory device in accordance with a first embodiment of the present invention;

DETAILED DESCRIPTION OF THE PREFERRED EMBODIMENTS

Figure 1:
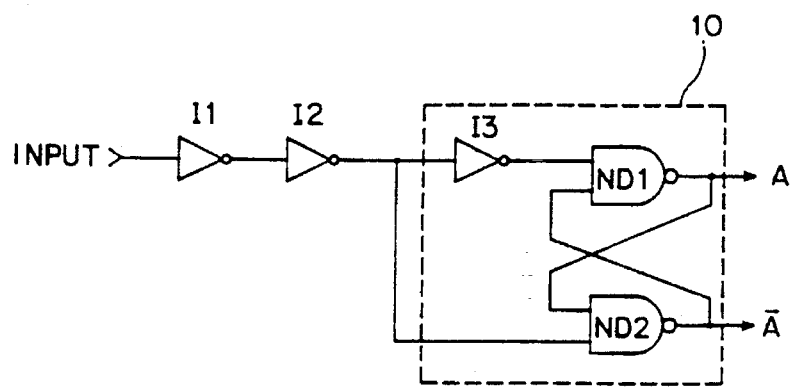
FIG. 1 is a circuit diagram of a conventional non-overlap signal generation circuit for a semiconductor memory device.
Figure 2:
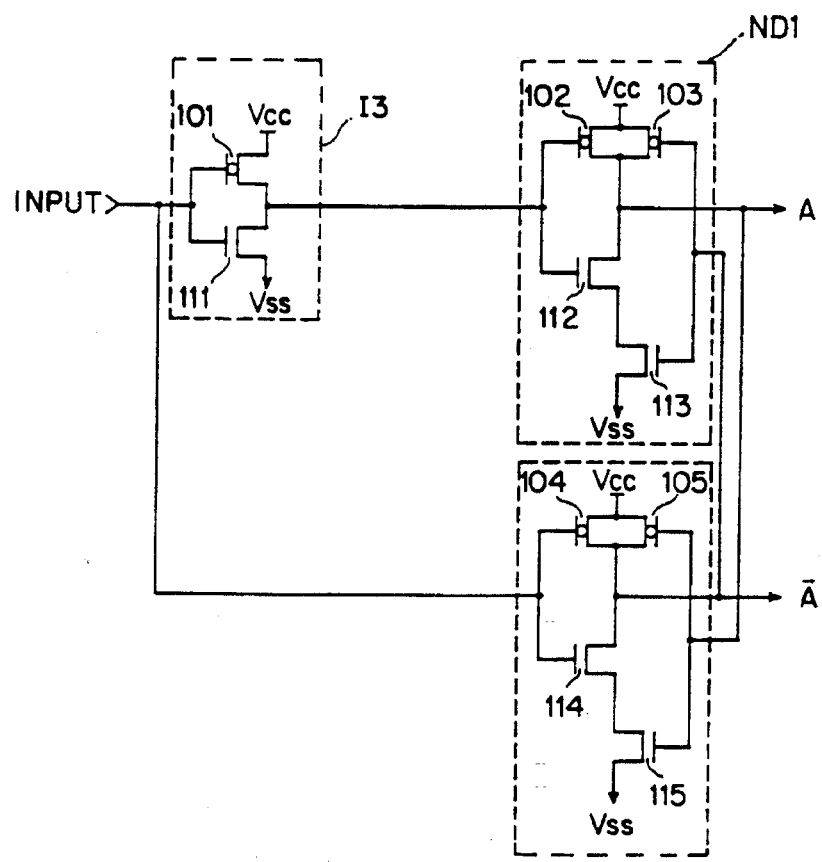
FIG. 2 is a detailed circuit diagram of a non-overlap circuit in FIG. 1.

Referring to FIG. 4, there is shown a circuit diagram of a non-overlap signal generation circuit for a semiconductor memory device in accordance with a first embodiment of the present invention. As shown in this drawing, the non-overlap signal generation circuit comprises two inverters I12 and I14 connected in series for inverting sequentially an input signal, and a non-overlap circuit 30 for generating two nonoverlapped output signals A and /A of complementary logic levels with respect to the input signal. The non-overlap circuit 30 includes two inverters 16 and 22, two PMOS transistors 18 and 24, and two NMOS transistors 20 and 26.

The non-overlap circuit 30 includes two data paths for generating the first and second output signals A and /A, respectively. The first data path consists of the inverter 16, the PMOS transistor 18 and the NMOS transistor 20. The second data path consists of the inverter 16, the inverter 22, the PMOS transistor 24 and the NMOS transistor 26. The input signal is sequentially inverted by the inverters I12 and I14 and then applied to the non-overlap circuit 30. In the first data path of the non-overlap circuit 30, an output signal from the inverter I14 is applied to the inverter 16 and a source of the PMOS transistor 18, a gate and a drain of which are connected respectively to a ground terminal Vss and a drain of the NMOS transistor 20 which generates the first output signal A. The NMOS transistor 20 has a gate connected to an output terminal of the inverter 16 and a source connected to the ground terminal Vss. In the second data path of the non-overlap circuit 30, an output signal from the inverter 16 is applied to the inverter 22 and a source of the PMOS transistor 24, a gate and a drain of which are connected respectively to the ground terminal Vss and a drain of the NMOS transistor 26 which generates the second output signal /A. The NMOS transistor 26 has a gate connected to an output terminal of the inverter 22 and a source cotnnected to the ground terminal Vss.

The operation of the non-overlap signal generation circuit with the abovementioned construction in accordance with the first embodiment of the present invention will hereinafter be described in detail.

First, the operation of the non-overlap signal generation circuit will hereinafter be described with respect to the case where the input signal is transited from logic "0" to logic "1".

The input signal of logic "1" is sequentially inverted by the inverters 12 and 14 and then applied to the inverter 16 and the source of the turned-on PMOS transistor 18. The output signal from the inverter 16 is applied to the gate of the NMOS transistor 20, thereby causing the NMOS transistor 20 to be turned off. As a result, a first output node N1 is charged, thereby causing the first output signal A to become logic "1". Also, the output signal from the inverter 16 is applied to the source of the turned-on PMOS transistor 24 and through the inverter 22 to the gate of the NMOS transistor 26, thereby causing the NMOS transistor 26 to be turned on. As a result, a second output node N2 is discharged, thereby causing the second output signal /A to become logic "0".

In more detail, the output of the inverter 14 become logic "1" as the input signal is transited from logic "0" to logic "1". At this time, because a PMOS transistor (not shown) of the inverter 14 is turned on, whereas an NMOS transistor (not shown) thereof is turned off, a supply voltage is transferred to the first output node N1 through the turned-on PMOS transistor of the inverter 14 and the turned-on PMOS transistor 18 in the non-overlap circuit 30.

Also, the output of the inverter 16 become logic "0" as the input signal is transited from logic "0" to logic "1". The output signal of logic "0" from the inverter 16 is applied to the NMOS transistor 20, thereby causing the NMOS transistor 20 to be turned off. At this time, because a PMOS transistor (not shown) of the inverter 16 is turned off, whereas an NMOS transistor (not shown) thereof is turned on, the second output signal /A at the second output node N2 is discharged to the ground terminal Vss through the turned-on PMOS transistor 24 in the non-overlap circuit 30 and the turned-on NMOS transistor of the inverter 16. Also, the output signal of logic "1" from the inverter 22 is applied to the NMOS transistor 26, thereby causing the NMOS transistor 26 to be turned on. As a result, the second output signal /A at the second output node N2 is discharged to the ground terminal Vss through the turned-on NMOS transistor 26.

In other words, when the input signal is transited from logic "0" to logic "1", the supply voltage is transferred to the first output node N1 through the turned-on PMOS transistor of the inverter 14 and the turned-on PMOS transistor 18 in the non-overlap circuit 30 connected in series. As a result, the first output signal A at the first output node N1 is slowly charged to logic "1". The second output signal /A at the second output node N2 is transferred to the ground terminal Vss through the turned-on PMOS transistor 24 in the non-overlap circuit 30 and the turned-on NMOS transistor of the inverter 16 connected in series and the turned-on NMOS transistor 26 connected in parallel. As a result, the second output signal /A at the second output node N2 is fast discharged to logic "0".

Because the first output signal A is slowly charged to logic "1" and the second output signal /A is irast discharged to logic "0", a transition time difference is generated. Therefore, the first and second output signals A and /A cannot be overlapped because of the generation of the transition time difference between the first and second output nodes N1 and N2.

On the contrary, in the case wilere the input signal is transited from logic "1" to logic "0", the operation is performed in a similar manner to that in the case where the input signal is transited from logic "0" to logic "1". Namely, the first output signal A at the first output node N1 is transferred to the ground terminal Vss through the turned-on PMOS transistor 18 in the non-overlap circuit 30 and the turned-on NMOS transistor of the inverter 14 connected in series and the turned-on NMOS transistor 20 connected in parallel. As a result, the first output signal A at the first output node N1 is fast discharged to logic "0". The supply voltage is transferred to the second output node N2 through the turned-on PMOS transistor of the inverter 16 and the turned-on PMOS transistor 24 in the non-overlap circuit 30 connected in series. As a result, the second output signal /A at the second output node N2 is slowly charged to logic "1".

Then, since the second output signal /A is slowly charged to logic "1" and the first output signal A is fast discharged to logic "0", a transition time difference is generated. Therefore, the first and second output signals A and /A cannot be overlapped because of the generation of the transition time difference between the first and second output nodes N1 and N2.

In result, according to the first embodiment of the present invention, the output signal at the output node to be discharged is fast discharged through the two transistors connected in parallel to the output node. Also, the output signal at the output node to be charged is slowly charged through the two transistors connected in series to the output node. Theretore, the non-overlapped signals can be generated because of the transition time difference between the two output nodes.

Figure 5:
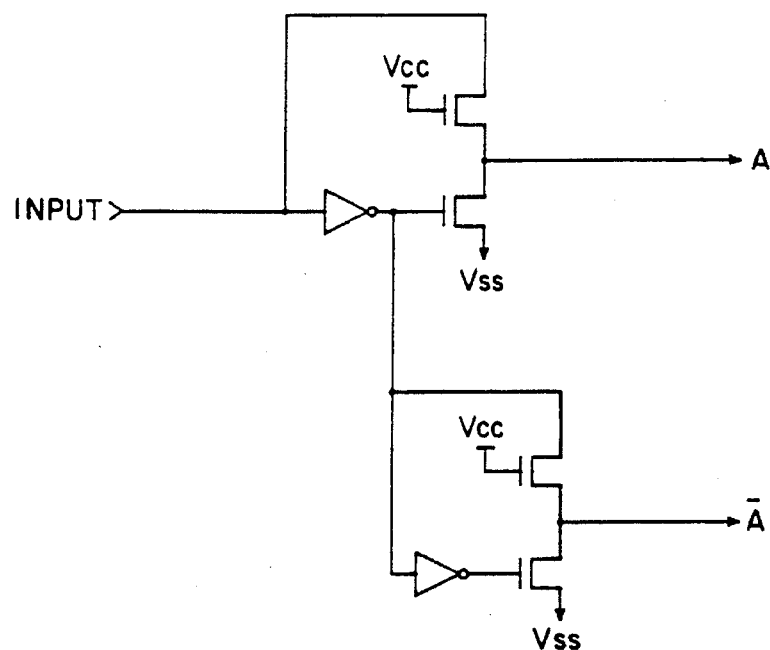
FIG. 5 is a detailed circuit diagram of a non-overlap circuit in FIG. 4 in accordance with a second embodiment of the present invention.

Referring to FIG. 5, there is shown a detailed circuit diagram of the non-overlap circuit 30 in FIG. 4 in accordance with a second embodiment of the present invention. The construction of this drawing is the same as that of FIG. 4, with the exception that NMOS transistors are provided instead of the PMOS transistors 18 and 24 on the first and second data paths and the supply voltage is applied to gates of the NMOS transistors. Those skilled in the art will appreciate that the construction of FIG. 5 has the same effect as that of the first embodiment of the present invention in FIG. 4 and a description thereof will thus be omitted.

Figure 6:
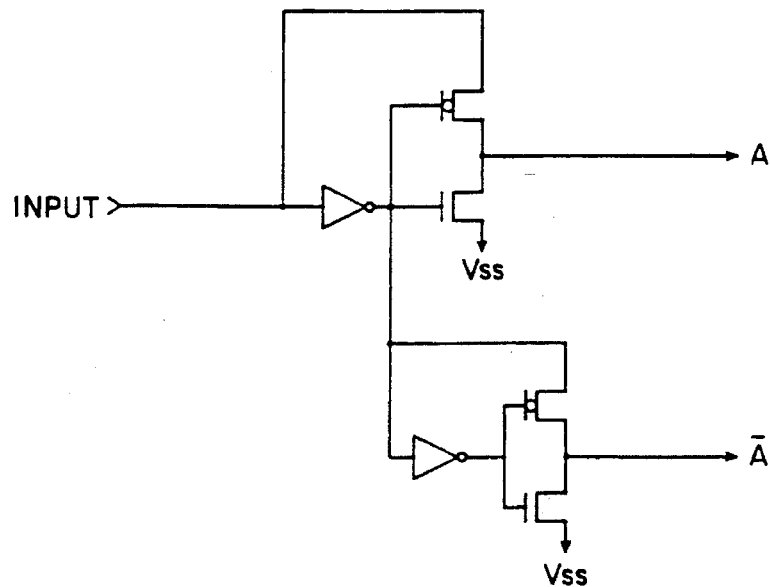
FIG. 6 is a detailed circuit diagram of the non-overlap circuit in FIG. 4 in accordance with a third embodiment of the present invention.

Referring to FIG. 6, there is shown a detailed circuit diagram of the non-overlap circuit 30 in FIG. 4 in accordance with a third embodiment of the present invention. The construction of this drawing is the same as that of FIG. 4, with the exception that the gates of the PMOS and NMOS transistors 18 and 22 on the first data path are connected in common and the gates of the PMOS and NMOS transistors 24 and 26 on the second data path are connected in common. Those skilled in the art will appreciate that the construction of FIG. 6 has the same effect as that of the first embodiment of the present invention in FIG. 4 and a description thereof will thus be omitted.

As apparent from the above description, according to the present invention, the non-overlap signal generation circuit has the components of the number smaller than that of the conventional non-overlap signal generation circuit. Therefore, the chip area can be reduced and the non-overlapped signals can readily be obtained by adjusting the sizes of the transistors. Also, the logic "0" discharging time is shorter than the logic "1" charging time and a signal transfer delay time is short. Therefore, the non-overlap signal generation circuit of the present invention can be applied to a high-speed operation of the semiconductor memory device.

Althottgh the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-overlap signal generation circuit for a semiconductor memory device which generates two non-overlapped output signals of complementary logic levels with respect to one input signal, comprising:

a first data path including a first transistor for transiting a first output node from logic "0" to logic "1" when said iput signal is transited from logic "0" to logic "1", whereas from logic "1" to logic "0" when said input signal is transited from logic "1" to logic "0", a first inverter for inverting said input signal, and a second transistor for transiting said first output node from logic "1" to logic "0" in response to an output signal from said first inverter; and a second data path including a third transistor for transiting a second output node from logic "0" to logic "1" when the output signal from said first inverter is transited from logic "0" to logic "1", whereas from logic "1" to logic "0" when the output signal from said first inverter is transited from logic "1" to logic "0", a second inverter for inverting the output signal from said first inverter, and a fourth transistor for transiting said second output node from logic "1" to logic "0" in response to an output signal from said second inverter;

whereby said two non-overlapped output signals are generated according to a time difference between said first and second data paths.

2. A non-overlap signal generation circuit for a semiconductor memory device as set forth in claim 1, wherein said first transistor is adapted to transfer a "1" logic signal to said first output node to charge said first output node when said input signal is transited from logic "0" to logic "1" and to transfer said "1" logic signal at said first output node to an input terminal to discharge said first output node when said input signal is transited from logic "1" to logic "0".

3. A non-overlap signal generation circuit for a semiconductor memory device as set forth in claim 2, wherein said first transistor is adapted to transfer said "1" logic signal at said first output node to said input terminal through an NMOS transistor of said first inverter when said input signal is transited from logic "1" to logic "0", said NMOS transistor of said first inverter being disposed in front of said input terminal.

4. A non-overlap signal generation circuit for a semiconductor memory device as set forth in claim 1, wherein said third transistor is adapted to transfer a "1" logic signal to said second output node to charge said second output node when said input signal is transited from logic "1" to logic "0" and to transfer said "1" logic signal at said second output node to an input terminal to discharge said second output node when said input signal is transited from logic "0" to logic "1".

5. A non-overlap signal generation circuit for a semiconductor memory device as set torch in claim 4, wherein said third transistor is adapted to transfer said "1" logic signal at said second output node to said input terminal through an NMOS transistor of said second inverter when said input signal is transited from logic "0" to logic "1".

6. A non-overlap signal generation circuit for a semiconductor memory device as set forth in claim 1, wherein said first and third transistors are PMOS transistors and said second and fourth transistors are NMOS transistors.

7. A non-overlap signal generation circuit for a semiconductor memory device as set forth in claim 6, wherein each of said first and third transistors has a gate connected to a ground terminal.

8. A non-overlap signal generation circuit for a semiconductor memory device as set forth in claim 1, wherein said first and third transistors are NMOS transistors and said second and fourth transistors are PMOS transistors.

9. A non-overlap signal generation circuit for a semiconductor memory device as set forth in claim 8, wherein each of said first and third transistors has a gate for inputting a supply voltage.

* * * * *